United States Patent [19]

Kimura

[11] Patent Number: 5,252,866
[45] Date of Patent: Oct. 12, 1993

[54] FREQUENCY MIXING CIRCUIT

[75] Inventor: Katsuji Kimura, Tokyo, Japan

[73] Assignee: NEC Corporation, Tokyo, Japan

[21] Appl. No.: 965,426

[22] Filed: Oct. 23, 1992

[30] Foreign Application Priority Data

Oct. 25, 1991 [JP] Japan .................. 3-307036

[51] Int. Cl.⁵ .............................. H03K 5/26
[52] U.S. Cl. .................. 307/529; 307/254; 307/355
[58] Field of Search ............ 307/529, 350, 355, 254

[56] References Cited

U.S. PATENT DOCUMENTS

| | | | |
|---|---|---|---|
| 3,710,149 | 1/1973 | Ohsawa | 307/529 |
| 4,324,990 | 4/1982 | Gay | 307/350 |
| 4,362,956 | 10/1982 | Orgasawara | 307/355 |
| 4,463,271 | 7/1984 | Gill | 307/350 |
| 4,795,916 | 1/1989 | Liron | 307/355 |
| 5,039,889 | 8/1991 | Janton et al. | 307/529 |

*Primary Examiner*—John S. Heyman
*Assistant Examiner*—My Trong Ton
*Attorney, Agent, or Firm*—Burns, Doane, Swecker & Mathis

[57] ABSTRACT

A frequency mixing circuit is provided which comprises first and second differential pairs each formed of two transistors different in emitter area from each other and constant current sources for respectively driving the first and second differential pairs. The collectors of the transistors having a large emitter area of K (K>1) and the collectors of the transistors having a small emitter area of 1 of the first and second differential pairs are respectively connected in common. Between the both differential pairs, the bases of the transistors having a emitter area of K and the bases of the transistors having a emitter area of 1 are respectively connected in common. A first AC signal to be mixed is applied to one of two sets of the commonly connected bases and a second AC signal to be mixed is applied to the other thereof. Thus, the degradation of NF can be reduced and a good high frequency characteristic can be obtained at a low current.

6 Claims, 2 Drawing Sheets

FREQUENCY MIXING CIRCUIT

BACKGROUND OF THE INVENTION

1. Field of the Invention

This invention relates to a frequency mixing circuit and more particularly, to a frequency mixing circuit formed on a bipolar integrated circuit.

2. Description of the Related Art

A conventional frequency mixing circuit is shown in FIG. 1, which comprises a differential amplifier formed of transistors Q11 and Q12 and a transistor Q13 serving to act as a current source for driving the differential amplifier. A load resistance RL is connected to the collector of the transistor Q12. A first frequency signal (voltage; VIN) is superposed on a reference voltage VF of the current source formed of the transistor Q13 and applied thereto, and a second frequency signal (voltage; VLO) is applied to the input terminals pair of the differential amplifier. The output of this circuit is taken out from one end of the load resistance RL.

The operation of this circuit will be explained below.

The junction diode (base-emitter junction) forming a transistor generally has the current characteristic as shown below, $$IE = IS \cdot exp(q \cdot VBE/kT) - 1 \qquad (1)$$

where
IE is the emitter current,
IS is the saturation current,
q is the unit electron charge,
VBE is the base-to-emitter voltage,
k is Boltzmann's constant, and
T is absolute temperature.

Here, if $VT = kT/q$, then $VBE >> VT$ in general. As a result, if $exp(VBE/VT) >> 1$ in the equation (1), the emitter current IE is approximated as follows;

$$IE \approx IS \cdot exp(VBE/VT) \qquad (2)$$

In this case, the collector current IC13 of the transistor Q13 serving to act as the current source can be expressed as follows;

$$IC13 = IS13 \cdot exp\{(VF + VIN)/VT\} \qquad (3)$$

Hence, if the constant current IO is expressed as $$IO = IS13 \cdot exp(VF/VT) \qquad (4),$$

from the equation (3), the collector current IC13 is expressed as follows;

$$IC13 = IO \cdot exp(VIN/VT) \qquad (5)$$

The differential input voltage VL0 of the second frequency signal becomes equal to the difference of the base-to-emitter voltage VBE11 of the transistor Q11 and the base-to-emitter voltage VBE12 of the transistor Q12, or $$VBE11 - VBE12 = VLO \qquad (6)$$

Then, suppose that the base-to-emitter voltages VBE11 and VBE12 are respectively expressed as the following equations (7) and (8) and suppose that IS11 and IS12 in the equations (7) and (8) are equal to each other as shown in the following equation (9), as $$VBE11 = VT \cdot ln(IC11/IS11) \qquad (7)$$

$$VBE12 = VT \cdot ln(IC12/IS12) \qquad (8)$$

$$IS11 = IS12 \qquad (9)$$

Then, the differential input voltage VLO shown in the equation (6) can be expressed as follows;

$$VT \cdot ln(IC11/IC12) = VLO \qquad (10)$$

On the other hand, if the DC common-base current gain factor of the transistors is expressed as $\alpha F$, the sum of the collector current IC11 and collector current IC12 can be expressed as follows:

$$IC11 + IC12 = \alpha F \cdot IC13 \qquad (11)$$

As a result, from the equations (10) and (11), the collector currents IC11 and IC12 can be respectively obtained as follows;

$$IC11 = \frac{\alpha F \cdot IC13}{1 + exp(-VLO/VT)} \qquad (12)$$

$$IC12 = \frac{\alpha F \cdot IC13}{1 + exp(VLO/VT)} \qquad (13)$$

Accordingly, the differential current $\Delta I3$ of the collector currents IC11 and IC12 can be expressed as follows;

$$\Delta I3 = IC11 - IC12 = \alpha F \cdot IC13 \cdot tanh(VLO/2VT) \qquad (14)$$
$$= \alpha F \cdot IO \cdot exp(VIN/VT) \cdot tanh(VLO/2VT)$$

where tanh X and exp X ($X << 1$) can be respectively expanded as follows;

$$tanh\, x = x - (1/3) \cdot x^3 + \ldots \qquad (15)$$

$$exp\, x = 1 + (x/1!) + (x^2/2!) + \ldots \qquad (16)$$

Then, if the equation (14) is expressed using the equations (15) and (16), the following can be obtained:

$$\begin{aligned}\Delta I3 &= \alpha F \cdot IO\{1 + (VIN/VT) + (1/2) \cdot (VIN^2/VT^2) + \ldots\} \times \\ &\quad [\{VLO/(2VT)\} - (1/3) \cdot \{VLO^3/(8VT^3)\} \ldots] \\ &= \alpha F \cdot IO\,[\{VLO/(2VT)\} - (1/24)(VLO^3/VT^3) + \\ &\quad (VIN \cdot VLO)/(2VT^2) - (VIN \cdot VLO^3)/(24VT^4) + \\ &\quad (VIN^2 \cdot VLO)/(4VT^3) - (VIN^2 \cdot VLO^3)/(48VT^5) \ldots]\end{aligned} \qquad (17)$$

As seen from the equation (17), the differential current $\Delta I3$ includes the term of the product $(VIN \cdot VLO)$ of the first frequency input voltage VIN and the second frequency input voltage VLO. Here, suppose that the input voltages VIN and VLO are respectively expressed as;

$$VIN = |VIN| \cdot COS\, 2\pi \cdot fIN \cdot t \qquad (18)$$

$$VLO = |VIN| \cdot COS\, 2\pi \cdot fLO \cdot t \qquad (19)$$

Then, the product (VIN·VLO) can be expressed as follows:

$$VIN \cdot VLO = (\tfrac{1}{2})|VIN||VLO| \times [\cos\{2\pi(fIN+fLO)t\} + \cos\{2\pi(fIN-fLO)t\}] \quad (20)$$

Hence, the components of the sum (fIN+fLO) and difference |fIN−fLO| of the first and second frequencies fIN and fLO can be obtained.

As seen from the equation (20), the factor specifying the frequency characteristic depends mainly on the frequency characteristic (transition frequency; fT) of the transistors used, so that it can be found that the circuit in FIG. 1 is the frequency mixing circuit having a good high frequency characteristic.

Since the collector currents IC11 and IC12 are differential currents, they can be expressed as follows:

$$IC11 = (\tfrac{1}{2})(\alpha F \cdot I0 + \Delta I3) \quad (21)$$

$$IC12 = (\tfrac{1}{2})(\alpha F \cdot I0 - \Delta I3) \quad (22)$$

As seen from these equations (21) and (22), the collector currents IC11 and IC12 respectively include the terms of $\{\pm(\tfrac{1}{2}) \cdot \Delta I3\}$. As a result, if the collector current IC11 or IC12 is converted into a voltage, the output voltage including the components of the sum (fIN+fLO) and difference |fIN−fLO| of the first and second frequencies fIN and fLO can be obtained.

In the circuit shown in FIG. 1, the collector current IC12 is converted into the voltage through the load resistance RL.

Another example of a conventional frequency mixing circuit is shown in FIG. 2, in which the first frequency signal (voltage; VIN) is applied to a first input terminal of an analog multiplier 31 such as the Gilbert multiplier or the like and the second frequency signal (voltage; VLO) is applied to a second input terminal thereof.

In FIG. 2, an output voltage VO can be expressed as follows;

$$VO = A \cdot VIN \cdot VLO \quad (23)$$

where A is a constant having a dimension of inverse voltage.

By substituting the equations (18) and (19) into the equation (23), similar to the equation (20), the output voltage VO can be obtained as follows:

$$VO = (A/2)|VIN||VLO| \times [\cos\{2\pi(fIN+fLO)t\} + \cos\{2\pi(fIN-fLO)t\}] \quad (24)$$

As a result, it can be found that the circuit using the analog multiplier 31 shown in FIG. 2 is a frequency mixing circuit similar to the circuit shown in FIG. 1.

In this case, however, with the conventional frequency mixing circuit shown in FIG. 1, there arises such a problem that in the transistor Q13 as the current source, it is difficult to superpose the signal voltage to the reference voltage for applying thereto. In addition, with another conventional frequency mixing circuit shown in FIG. 2, because the number of transistors to be used in the multiplier 31 is large, the noise factor (NF) is degraded, arising a problem that the circuit current is required to be increased in order to obtain a good high frequency characteristic.

SUMMARY OF THE INVENTION

Thus, an object of this invention is to provide a frequency mixing circuit which is superior in noise factor (NF) characteristic and is capable of good high frequency characteristic even at a low current consumption.

A frequency mixing circuit of this invention comprises first and second differential pairs each formed of two bipolar transistors having different emitter areas, and first and second constant current sources for respectively driving the first and second differential pairs. The collectors of the respective transistors having a large emitter area of the first and second differential pairs are connected in common and the collectors of the respective transistors having a small emitter area thereof are connected in common. The bases of the transistors having a large emitter area and the bases of the transistors having a small emitter area are respectively connected in common. A first alternating current signal to be mixed is applied to one of two sets of thus commonly connected bases and a second alternating current signal is applied to the other thereof.

The frequency mixing circuit of this invention has two sets of differential pairs each formed of two transistors different in emitter area from each other, that is, has two sets of so-called unbalanced differential pairs arranged transversally in a line. As a result, the number of circuit elements to be used can be reduced and the operation can be effected at a low voltage. Furthermore, the degradation of NF can be reduced and a good high frequency characteristic can be obtained at a low current of consumption.

The two transistors forming each of the first and second differential pairs is preferable to be made of so-called emitter-coupled pairs. Namely, the respective emitters of the two transistors forming the first differential pair are connected in common and the respective emitters of the two transistors forming the second differential pair are connected in common. In this case, it is preferable that the commonly connected emitters of the first differential pair are connected to a first constant current source and the commonly connected emitters of the second differential pair are connected to a second constant current source.

Besides, it is preferable that the emitter area ratio between the two transistors forming the first differential pair and the emitter area ratio between the two transistors forming the second differential pair are equal to each other. In this case, the constant currents respectively generated through the first and second constant current sources are set to be equal to each other.

The output signal may be obtained from one of the collector currents of the first and second differential pairs, but not limited thereto, may be obtained from the differential current of both of the collector currents.

DESCRIPTION OF THE PREFERRED EMBODIMENTS

Preferred embodiments of this invention will be described below.

First Embodiment

Figure 1:
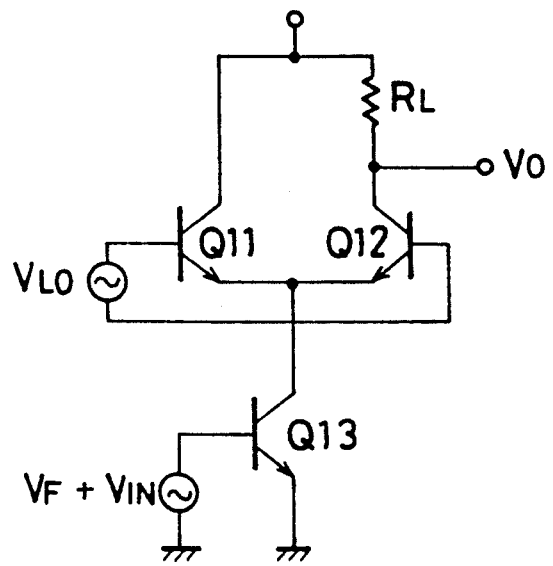
FIG. 1 is a circuit diagram one example of a conventional frequency mixing circuit.
Figure 2:
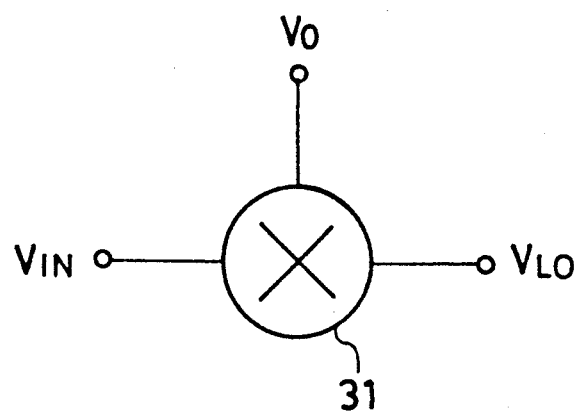
FIG. 2 shows another example of a conventional frequency mixing circuit.
Figure 3:
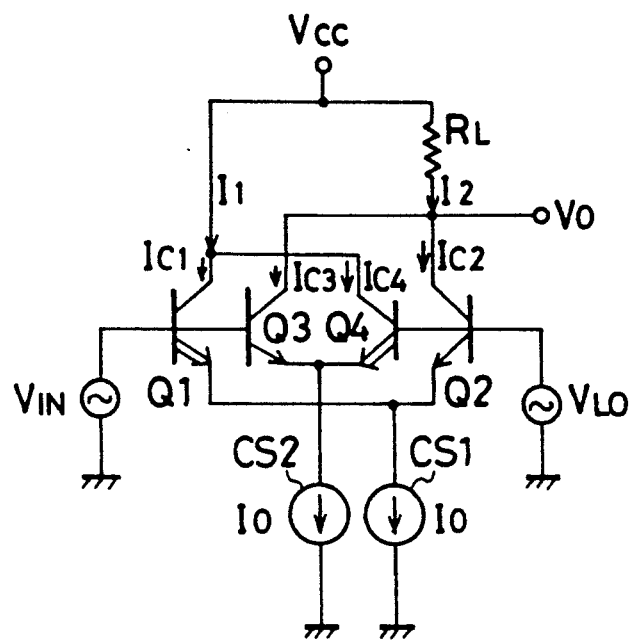
FIG. 3 is a circuit diagram of a frequency mixing circuit according to a first embodiment of this invention.

FIG. 3 shows a frequency mixing circuit of a first embodiment of this invention, which comprises a first differential pair of bipolar transistors Q1 and Q2, a constant current source CS1 for driving the first transistor pair, a second differential pair of bipolar transistors Q3 and Q4 and a constant current source CS2 for driving the second differential pair. These two sets of differential pair are composed respectively of two transistors different in emitter area from each other, forming so-called unbalanced differential pair. In this embodiment, if the emitter area of the transistor Q2 of the first differential pair is 1, the emitter area of the transistor Q1 thereof is made as to be K (K>1), and similarly, if the emitter area of the transistor Q3 of the second differential pair is 1, the emitter area of the transistor Q4 is made as to be K. Namely, the emitter area ratio of the transistors in the each differential pair becomes K:1. As a result, the current values of the constant current sources CS1 and CS2 are made equal as to be IO.

Between the first and second differential pairs, the collectors of the transistors Q1 and Q4 each having the emitter area as large as K are connected in common and the collectors of the transistors Q2 and Q3 each having the emitter area as small as 1 are connected in common. The four collectors thus respectively connected in common are connected in common to a power source (voltage: VCC). In this embodiment, the collectors of the transistors Q1 and Q4 having the large emitter area of K are directly connected to the power source and the collectors of the transistors Q2 and Q3 having the small emitter area of 1 are connected through a load resistance RL to the power source. The output voltage VO is taken from one end of the load resistance RL.

The base of the transistor Q1 having the large emitter area of K of the first differential pair and the base of the transistor Q2 having the small emitter area of 1 of the second differential pair are connected in common, and the base of the transistor Q4 having the large emitter area of K of the second differential pair and the base of the transistor Q2 having the small emitter area of 1 of the first differential pair are connected in common. A first frequency alternating current (AC) signal (voltage: VIN) is applied between the commonly connected bases of the transistors Q1 and Q3 and the ground, and a second frequency alternating current (AC) signal (voltage: VLO) is applied between the commonly connected bases of the transistors Q2 and Q4 and the ground.

The emitters of the transistors Q1 and Q2 of the first differential pair are connected in common to the constant current source CS1 and the emitters of the transistors Q3 and Q4 of the second differential pair are connected in common to the constant current source CS2.

As described above, the first and second differential pairs constitute so-called unbalanced emitter-coupled differential pairs, respectively. In addition, it can be said that the emitters and bases of the transistors Q1, Q2, Q3 and Q4 are so-called cross-coupled, respectively and the collectors thereof are so-called parallel connected with each other.

Here, in the first unbalanced differential pair of the transistors Q1 and Q2, if the difference of the input voltages VIN and VLO is expressed as a voltage V1, or $$V1 = VIN - VLO \tag{25}$$

then, the voltage V1 is equal to the difference of the base-to-emitter voltage VBE1 of the transistor Q1 and the base-to-emitter voltage VBE2 of the transistor Q2, or $$V1 = VBE1 - VBE2 \tag{26}$$

The base-to-emitter voltages VBE1 and VBE2 of the transistors Q1 and Q2 can be expressed as follows, similarly to the equations (7) and (8):

$$VBE1 = VT \cdot \ln(IC1/IS1) \tag{27}$$

$$VBE2 = VT \cdot \ln(IC2/IS2) \tag{28}$$

where VT is kT/q.

IC1 and IC2 are collector currents of the transistors Q1 and Q2, respectively.

IS1 and IS2 are saturation currents of the transistors Q1 and Q2, respectively.

The saturation currents IS1 and IS2 can be related as shown below since the emitter area ratio is K, or $$IS1 = K \cdot IS2 \tag{29}$$

As a result, by substituting the equations (27) and (28) into the equation (26), the ratio of the collector currents IC1 and IC2 can be obtained as follows;

$$(1/K)(IC1/IC2) = \exp(V1/VT) \tag{30}$$

On the other hand, if the DC common-base current gain factor is expressed as $\alpha F$, the constant current IO of the constant current source CS1 and the collector currents IC1 and IC2 of the transistors Q1 and Q2 are related as follows;

$$IC1 + IC2 = \alpha F \cdot IO \tag{31}$$

Hence, the collector currents IC1 and IC2 can be obtained as follows:

$$IC1 = \frac{\alpha F \cdot IO}{1 + (1/K) \cdot \exp(-V1/VT)} \tag{32}$$

$$IC2 = \frac{\alpha F \cdot IO}{1 + K \cdot \exp(V1/VT)} \tag{33}$$

Here, the emitter area ratio K is defined as below using VT (=kT/q), $$K = \exp(VK/VT) \tag{34}$$

Thus, VK can be expressed as follows;

$$VK = VT \cdot \ln K \tag{35}$$

As a result, the equations (32) and (33) can be respectively changed as follows:

$$IC1 = \frac{\alpha F \cdot IO}{1 + \exp\{-(V1 + Vk)/VT\}} \tag{36}$$

-continued
$$IC2 = \frac{\alpha F \cdot IO}{1 + \exp\{(V1 + Vk)/VT\}} \quad (37)$$

Accordingly, the differential current ΔI1 of the collector currents IC1 and IC2 can be expressed as follows;

$$\begin{aligned}
\Delta I1 &= IC1 - IC2 \\
&= \alpha F \cdot IO \cdot \tanh\{(V1 + VK)/2VT\}
\end{aligned} \quad (38)$$

Referring to the second unbalanced differential pair of the transistors Q3 and Q4, similarly, the differential current ΔI2 of the collector currents IC3 and IC4 of the transistors Q3 and Q4 can be expressed as follows;

$$\begin{aligned}
\Delta I2 &= IC4 - IC3 \\
&= -\alpha F \cdot IO \cdot \tanh\{(V1 - VK)/2VT\}
\end{aligned} \quad (39)$$

If the collector currents I1 and I2 of the first and second unbalanced differential pairs are defined respectively as shown in FIG. 3, and if the difference therebetween is expressed as ΔI, the following equation can be obtained as;

$$\begin{aligned}
\Delta I &= I1 - I2 \quad (40) \\
&= (IC1 + IC4) - (IC2 + IC3) \\
&= (IC1 - IC2) - (IC3 - IC4) \\
&= \Delta I1 + \Delta I2 \\
&= \alpha F \cdot IO \, [\tanh\{(V1 + VK)/2VT\} - \\
&\quad \tanh\{(V1 - VK)/2VT\}]
\end{aligned}$$

By expanding the term of tanh of the equation (40) by applying the equation (15), the following equation (41) can be obtained, thus being obtainable the differential output proportional to the square of the differential voltage V1, as $$\begin{aligned}
\Delta I &= \alpha F \cdot IO \, [\{(V1 + VK)/2VT\} - \quad (41) \\
&\quad (1/3)(V1 + VK)^3/(8VT^3) \ldots - \\
&\quad (V1 - VK)/(2VT) - (1/3)(V1 - VK)^3/ \\
&\quad (8VT^3) \ldots] \\
&= \alpha F \cdot IO \, \{(VK/VT) - (VK/4VT^3) \cdot V1^2 - \\
&\quad (2/3)(VK/2VT)^3 \ldots\}
\end{aligned}$$

Here, the differential voltage V1 can be given by the equation (25), and if the input voltages VIN and VLO are defined respectively as shown by the equations (18) and (19), the square of the differential voltage V1 can be obtained as follows;

$$\begin{aligned}
V1^2 &= (VIN - VLO)^2 \quad (42) \\
&= (|VIN|\cos 2\pi \cdot fIN \cdot t - |VLO|\cos 2\pi \cdot fLO \cdot t)^2 \\
&= |VIN|^2 \cos^2 2\pi \cdot fIN \cdot t + |VLO|^2 \cos^2 2\pi \cdot fLO \cdot \\
&\quad t - 2|VIN||VLO|\cos 2\pi \cdot fIN \cdot t \cdot \cos 2\pi \cdot fLO \cdot t
\end{aligned}$$

-continued
$$\begin{aligned}
&= (1/2)|VIN|^2 + (1/2)|VLO|^2 + \\
&\quad (1/2)|VIN|^2 \cos 4\pi \cdot fIN \cdot t + \\
&\quad (1/2)|VLO|^2 \cos 4\pi \cdot fLO \cdot t - \\
&\quad |VIN||VLO|\cos\{2\pi(fIN + fLO)t\} - \\
&\quad |VIN||VLO|\cos\{2\pi(fIN - fLO)t\}
\end{aligned}$$

As seen from the equation (42), the square of the differential voltage V1 includes the component of the sum (fIN+fLO) and the component of the difference |fIN−fLO| of the two frequencies fIN and fLO, and as a result, the differential current ΔI shown by the equation (41) also includes the components of the sum and difference of them. Since the collector currents I1 and I2 of respective differential pairs are differential currents, they can be respectively shown as below;

$$I1 = IC1 = IC4 = \alpha F \cdot IO = (\tfrac{1}{2})\Delta I \quad (43)$$

$$I2 = IC2 + IC3 = \alpha F \cdot IO - (\tfrac{1}{2})\Delta I \quad (44)$$

As seen from the equations (43) and (44), the collector currents I1 and I2 also include the components of the sum (fIN+fLO) and difference |fIN−fLO| of the two frequencies fIN and fLO.

In this embodiment, the collector current I2 of the second differential pair is converted into the voltage by the load resistance RL, and the output voltage VO becomes as shown by the following equation (45). This means that the output voltage VO including the component of the sum (fIN+fLO) and the component of the difference |fIN−fLO| of the two frequencies fIN and fLO can be obtained.

$$\begin{aligned}
VO &= VCC - RL \cdot I2 \quad (45) \\
&= VCC - RL(IC2 + IC3) \\
&= VCC - RL\{IO - (1/2)\Delta I\} \\
&= VCC - RL \cdot IO + (1/2)RL \cdot \Delta I
\end{aligned}$$

As explained above, the frequency mixing circuit as shown above makes it possible to reduce the number of circuit elements to be used and to operate it at a low voltage. Consequently, the degradation of noise factor (NF) can be reduced and a good high frequency characteristic can be obtained with a low consumption of current.

In this embodiment, the collector current I2 of the second differential pair is converted into the voltage, however, since the collector current I1 also includes the component of the sum (fIN+fLO) and the component of the difference |fIN−fLO| of the two frequencies fIN and fLO, so that it is evident that the same result as shown above can be obtained even if the collector current I1 of the first differential pair is converted into the voltage.

Second Embodiment

Figure 4:
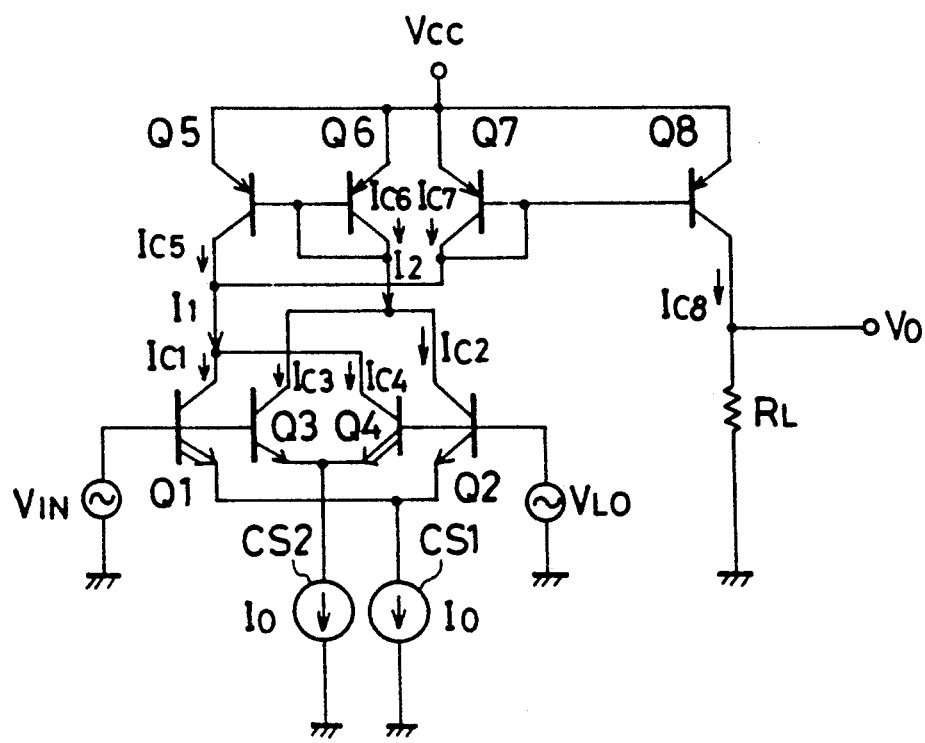
FIG. 4 is a circuit diagram of a frequency mixing circuit according to a second embodiment of this invention.

FIG. 4 shows a frequency mixing circuit according to a second embodiment of this invention, in which an output signal is obtained from the current ΔI of the difference between the collector currents I1 and I2.

The circuit of this embodiment comprises a circuit whose configuration is same as that of the first embodiment and two current mirror circuits for generating the differential current ΔI. A first current mirror circuit consists of transistors Q5 and Q6 and a second current mirror circuit consists of transistors Q7 and Q8. The load resistance RL is connected to the collector of the transistors Q8.

In this embodiment, collector currents of the transistors Q5, Q6, Q7 and Q8 are rspectively expressed as IC5, IC6, IC7 and IC8 and suppose that the DC common-base gain factor $\alpha F \approx 1$, the following equations are established;

$$IC5 = IC6 = I2 \quad (46)$$

$$IC5 + IC7 = I1 \quad (47)$$

$$IC8 = I1 - I2 = \Delta I \quad (48)$$

where $I1 \geq I2$.

The output voltage VL0 is expressed as the following equation (49);

$$\begin{aligned} VO &= RL \cdot IC8 \\ &= RL \cdot \Delta I = RL \cdot (I1 - I2) \end{aligned} \quad (49)$$

Thus, in this embodiment, the differential current ΔI itself is converted into the voltage and as a result, the output voltage V0 which includes the component of the sum (fIN+fLO) and the component of the difference |fIN−fLO| of the frequencies fIN and fLO of the input signals can be obtained.

In the above-described embodiments, the emitter area ratios of the transistors respectively forming the first and second differential pairs are equal to each other as to be K, but not limited thereto, they may be different from each other. In such case, the constant current value generated by the constant current source should be differed correspondingly to the emitter area ratio.

What is claimed is:

1. A frequency mixing circuit, comprising:
    a first differential pair of two bipolar transistors whose emitter areas are different from each other;
    a first constant current source for driving said first differential pair;
    a second differential pair of two bipolar transistors whose emitter areas are different from each other; and
    a second constant current source for driving said second differential pair;
    wherein the collectors of said respective transistors having a large emitter area of said first and second differential pairs are connected in common and the collectors of said respective transistors having a small emitter area of said first and second differential pairs are connected in common;
    the base of said transistor having a large emitter area of said first differential pair and the base of said transistor having a small emitter area of said second differential pair are connected in common, and the base of said transistor having a large emitter area of said second differential pair and the base of said transistor having a small emitter area of said first differential pair are connected in common; and
    a first alternating current signal to be mixed is applied to one of two sets of said commonly connected bases and a second alternating current signal to be mixed is applied to the other set thereof.

2. The frequency mixing circuit according to claim 1, wherein said two transistors of said first differential pair have their emitters connected in common and said two transistors forming said second differential pair have their emitters connected in common.

3. The frequency mixing circuit according to claim 1, wherein the emitter area ratio of said two transistors of said first differential pair and the emitter area ratio of said two transistors of said second differential pair are set to be equal to each other.

4. The frequency mixing circuit according to claim 2, wherein the emitter area ratio of said two transistors of said first differential pair and the emitter area ratio of said two transistors forming said second differential pair are set to be equal to each other.

5. The frequency mixing circuit according to claim 1, wherein an output signal is obtained from one of the collector current of said first differential pair and the collector current of said second differential pair.

6. The frequency mixing circuit according to claim 1, wherein an output signal is obtained from the differential current between the collector current of said first differential pair and the collector current of said second differential pair.

* * * * *